(12) United States Patent
Miske

(10) Patent No.: US 8,254,069 B2
(45) Date of Patent: Aug. 28, 2012

(54) ESD PROTECTION FOR OUTPUTS

(75) Inventor: Myron J. Miske, Newfields, NH (US)

(73) Assignee: Fairchild Semiconductor Corporation, San Jose, CA (US)

( * ) Notice: Subject to any disclaimer, the term of this patent is extended or adjusted under 35 U.S.C. 154(b) by 595 days.

(21) Appl. No.: 11/261,812

(22) Filed: Oct. 28, 2005

(65) Prior Publication Data
US 2007/0097568 A1 May 3, 2007

(51) Int. Cl.
*H02H 9/00* (2006.01)
(52) U.S. Cl. .......................................... 361/56; 361/91.1
(58) Field of Classification Search .................... 361/56, 361/91.1
See application file for complete search history.

(56) References Cited

U.S. PATENT DOCUMENTS

| | | | | |
|---|---|---|---|---|
| 4,855,620 | A * | 8/1989 | Duvvury et al. | 326/119 |
| 5,239,440 | A | 8/1993 | Merrill | |
| 5,946,175 | A * | 8/1999 | Yu | 361/56 |
| 6,118,323 | A * | 9/2000 | Chaine et al. | 327/333 |
| 6,385,021 | B1 * | 5/2002 | Takeda et al. | 361/56 |
| 2002/0140489 | A1 * | 10/2002 | Maloney et al. | 327/310 |
| 2003/0016062 | A1 * | 1/2003 | Ahsanullah et al. | 327/108 |
| 2004/0136126 | A1 * | 7/2004 | Smith | 361/56 |
| 2005/0046443 | A1 * | 3/2005 | McCalmont | 326/80 |

OTHER PUBLICATIONS

Duvvury, C., Diaz, C. and Haddock, T., Achieving Uniform NMOS Device Power Distribution For Sub-micron ESD Reliability, IEDM Technical Digest, 1992.

* cited by examiner

*Primary Examiner* — Jared Fureman
*Assistant Examiner* — Nicholas Ieva
(74) *Attorney, Agent, or Firm* — Schwegman, Lundberg & Woessner, P.A.

(57) ABSTRACT

An ESD protection circuit is described that protects the output transistors of a target circuit, usually an integrated circuit, that has an output enable, OE, or similar control input. An OE signal turns off the output transistors allowing the target circuit output, or outputs, to electrically float. Such a condition is commonly called a three state condition. The inventive protection circuit is not connected to the output directly, it senses an ESD voltage spike at the +Vdd contact to the circuit and produces a timed signal. The timed signal is converted to logic levels and gated with the OE signal (that the system previously provided to the OE control input). The output of gate forms a new OE control input signal that forces the target circuit into its three state condition during the period of the timed signal.

5 Claims, 1 Drawing Sheet

ESD PROTECTION FOR OUTPUTS

BACKGROUND OF THE INVENTION

1. Field of the Invention

The present invention relates to electro-static discharge (ESD) protection circuits for integrated circuits, and more particularly ESD protection of an integrated circuit's output MOS transistors.

2. Background Information

As integrated circuits (ICs), especially CMOS circuits, are reduced in size into the sub-micron range with ever thinner oxide layers, shallower junctions, more lightly doped structures, and silicided diffusions, the structures become ever more susceptible to ESD induced failures. Human and/or mechanical handling produces static charges that can and do cause destructive failure in such ICs. The components most at risk of such a failure are those that are electrically connected to output terminals or pads leading off the printed circuit board that carry the components. It has been found that human body ESD stress will damage an output NMOS even though there is a primary ESD protection cell located on the NMOS.

ESD voltage stress, event, ESD voltage spike or voltage stress is understood in the art as being interchangeable.

Generally, ESD voltage stresses produce voltages that permanently damage thin oxide insulting layers and/or uneven current densities that damage junctions and/or diffusion profiles in small areas. These mechanisms have been well documented in the art. For example, see "Achieving Uniform NMOS Device Power Distribution for Sub-micron ESD Reliability," by C. Duvvury, C. Diaz, and T. Haddock, in IEDM *Technical Digest*, 1992.

Prior art ESD protect circuits include series resistors, filter capacitors, clamp diodes and Zeners or other such breakdown devices employed at the terminals to limit the effect of the ESD event. These protection techniques are designed, inter alia, with marginal success to trigger at ESD voltages higher than the typical operating voltages of the product itself, so that the ESD protection does not interfere with the typical product functional operation.

The problem is that an ESD event at an output, where the output has an NMOS to Vss, or ground and a PMOS to a power rail, Vdd, couples through the PMOS capacitor to the Vdd rail and through the logic circuitry involved to turn on the NMOS. The NMOS discharges the ESD event and prevents primary ESD protection devices from operating fully, if at all. More troublesome is that as the NMOS is turning on, it may enter a "snap-back" condition (well known in the art) where parasitic bipolar transistors may turn on. In such conditions the output NMOS often will fail or be substantially weakened so as to exhibit increase leakage after the ESD stress is removed. Such components may fail in the field, which is worse. FIG. 1 illustrates the operation. Even with clamps 10 on the output, the NMOS N1 may turn on. The clamp 10 is shown generically. A positive going voltage spike on the OUTPUT, say by a human touching it, is coupled through the output capacitances C1 and C2 of the PMOS's P1 and P2 to the gate of N1. There is nothing to prevent N1 from turning on and reducing the voltage spike. Reducing the voltage spike may interfere with the primary ESD protection device, the clamps 10, or any protective circuits attached directly to the +Vdd line from fully activating. As discussed later, in fact, the NMOS N1 and the clamps 10 will share discharging the voltage spike, but the issue is that N1 is susceptible to failure.

U.S. Pat. No. 5,239,440 to Merrill addresses such an issue. Merrill provides a single RC detection circuit to actively turn on protective MOS switches attached to each output. On each output there is a transistor switch to Vcc and one to Vss (one to power and one to ground). Depending on the polarity of the ESD event, the proper switch is activated.

The prior art circuits have a number of limitations that are directly addressed by the present invention. Among those limitations is that the pull down NMOS on the output still may turn on, regardless of the switches or clamps on the output node. Moreover, the switches on each output provide a connection between each output (for example when the switches are not activated) that may allow transients to cause noise in adjacent output even with the low impedance Vcc or ground connections. Another significant limitation is that the two switches (as in the Merrill "clamp") on each output occupy valuable chip area.

SUMMARY OF THE INVENTION

The present invention provides protection for target circuits with output transistor drivers from an ESD voltage stress without making direct contact with the output nodes. It is efficient of chip area, and it protects better by ensuring the output transistors remain off during an ESD voltage stress or similar event.

Many (or most) output buffer circuits or logic circuits have output driver transistors that connect to output nodes or terminals. Many of these are integrated circuits, IC's, that have output enable functions. Typically such circuits have outputs that are called "three state." The outputs may be logically high, low or floating (open circuited). In these circuits, a logic input is directed through circuitry to cause output transistors to turn on or off thereby driving the output high or low (a one or a zero logic state). In addition, when the output enable, or OE, is false, the OE dominates the logic signal and the output transistors are securely forced off (usually there are two output MOS transistors per output node—a pull up and a pull down). In such a condition, the output node is left floating, this floating condition being the third state. The OE signal typically is connected within the IC directly or nearly directly to the output transistors.

Often a group of output buffer circuits are contained in a single chip or package with a single common OE connection that runs to all the actual output transistors. The chip or package has a single (usually) +Vdd power rail and a ground (Vss) connection. The present invention provides ESD protection from an ESD voltage stress that occurs on the target circuit output node. The ESD voltage stress is transferred to the +Vdd power rail in the target IC via the output pull up transistor. The present invention has a detection circuit that receives an ESD voltage stress directly from the +Vdd power rail and transfers it through a capacitor to the input of an inverter. The capacitor also connects to a resistor to ground, the RC combination forming a differentiation circuit with a characteristic time constant. The voltage stress activates the inverter when its threshold is reached. The inverter will remain active until the RC charges the capacitor such that the inverter input falls below the threshold. The output of the inverter is a logic timed square wave. The inverter output is fed through circuitry and is combined or gated with the usual OE signal so that during an ESD voltage stress, the OE input to the output circuit is false, and the output transistors are off. In preferred embodiments, the gating may be a NAND, NOR, AND, OR or wired OR depending on the actual application.

The present invention provides an ESD protection circuit that drives the OE input of an integrated or other circuit. Since the OE signal typically controls at least a byte or as much as a full word that may contain thirty-two, sixty-four or even more bits, a single inventive ESD circuit, with no physical connection to the output nodes, can protect all the output driver transistors.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
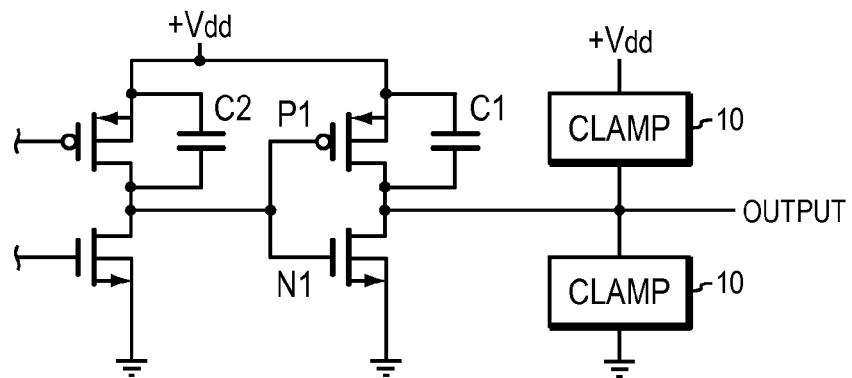
FIG. 1 is a circuit showing the prior art circuitry and its limitations.
Figure 2A:
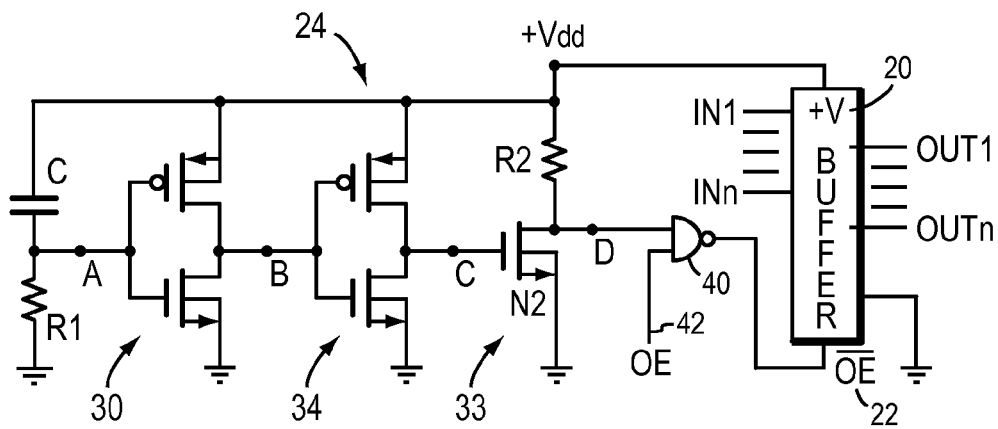
FIG. 2A is a circuit schematic example illustrating the present invention.

FIG. 2A shows a circuit schematic of a particular example illustrating the present invention. Here a buffer 20 is an output driver that transfers logic input signals (IN1-INn) to the outputs (OUT1-OUTn). The buffer 20 has a low true OE 22 signal that will set the output transistors into a three state condition regardless of the logic inputs. The power rail Vdd is coupled from the buffer 20 to the ESD protective circuit 24.

Figure 2B:
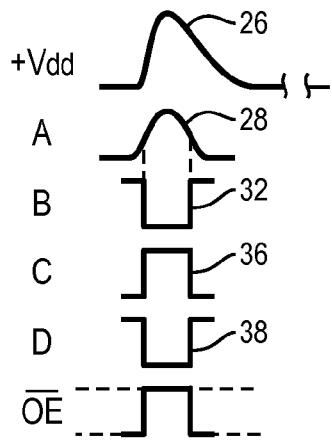
FIG. 2B is a time graph of signals associated with FIG. 2A.

As shown in FIG. 2B, when an ESD positive going voltage spike 26 occurs, that spike 26 transfers a signal across the capacitor C to point A. Point A rises 28 in response and then, depending on the RC, and the edges of the ESD voltage spike, the RC will act to differentiate the ESD signal 26. Point A rises passing the threshold of the inverter 30 causing a low going logic level signal 32 at point B. This in turn is inverted by the inverter 34 to form the high going logic signal 36 at point C. The signal at point C turns on NMOS N2 causing the logic signal 38 at point D to go low. This low at point D via the NAND gate 40 forces the output 22 of the NAND 40 to go high. Since this output is the low true OE signal into the buffer 20, the buffer is forced into a three state condition, and the output NMOS transistors in each of the output circuits are held off.

In a preferred embodiment, the width of the signals, B, C, D are arranged to be about 200 nanoseconds, but other times may be used. The capacitor is typically a reversed biased diode, and the values of the C and the R are best selected via simulations. Size tradeoffs between the C and the R, and other tradeoffs that might exist for particular applications, will be understood by those skilled in the art.

As shown in FIG. 2A, the NAND gate 40 in routine operations transfers a high true OE signal 42 to the low true OE signal 22. In the absence of any ESD voltage spike, point D is held high via R22 since N2 of the inverter 33 is held off, and NAND 40 acts only to invert the output enable signal on its way to the buffer 20.

Figure 3:
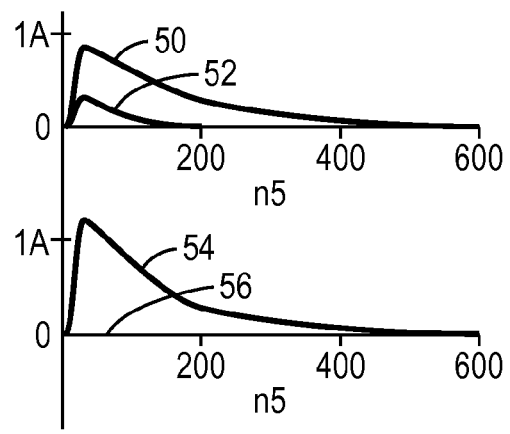
FIG. 3 illustrates charts of ESD voltage stress current sharing of the prior art protection and the protection of the present invention.

FIG. 3 shows two graphs illustrating the advantage of the present invention. Trace 50 peaks at about 900 mA and represents the current in the buffer output NMOS when the present invention is not employed. The circuit did have the prior art primary ESD clamps tied to the output node itself. At this time the trace 52 represents the current in the primary ESD device. This current peaks at about 250 mA. Clearly, the output NMOS is at risk. Trace 54 represents the current in the primary ESD device when the present invention is used. Here the current peaks at about 1.2 A, and there is no current 56 in the output NMOS. Experiments conducted show that the output pin's ESD stress tolerance increased from 1 kV to 4 kV.

There is usually a PMOS pull up transistor in the buffer outputs. The present invention is discussed herein about protecting the output NMOS pull down transistor. However, the PMOS is also protected as driving the OE false will also ensure that the PMOS is off. This might be important in applications where the ESD event is a negative spike. The primary protection for negative spikes may be the Merrill circuit or often it is a diode from Vss to +Vdd, where the diode conducts forward when +Vdd falls below the Vss level. The above is well known to those in the field.

There are indications that snap-back conditions exist in the NMOS circuit without the present invention resulting in leakage after the ESD stress is removed. The circuit with the present invention shows no snap-back and no leakage.

In practice, the primary ESD protection may be tied to the buffer outputs, and the present invention will assure that these primary devices will substantially bear the ESD stress. However, using the present invention, the primary ESD protection devices may be attached between the +Vdd and Vss rails near or at the buffer chip/package. Of course the present invention may be applied to any circuit susceptible to ESD stresses, especially those with an OE control or similar control input.

Note that the closer the OE control input is to the output driving transistors, the more effective the protection will be. If there is substantial circuitry between the output transistor and the OE signal, the efficiency of the present invention will diminish.

Also, the present invention may be applied to other circuits to protect pull up transistors as well as pull down transistors.

What is claimed is:

1. A protection circuit that protects the output transistors of a target circuit from a positive-going ESD voltage spike that appears on a positive power rail of the target circuit, the target circuit having an output node functionally connected or coupled to the output transistors as well as an output enable input, the protection circuit comprising:

the output transistors coupled between the positive power rail and a ground connection wherein the positive going ESD voltage spike appears at the coupling between the output transistors and the positive power rail;

a coupling from the power rail to the output transistors, wherein the ESD voltage spike appears on at least one of the output transistors;

at least a first and a second CMOS pair, each connected between said power rail and a reference potential;

a capacitor connected between said power rail and a gate input of said first CMOS pair for coupling an ESD voltage spike to said first CMOS pair, a resistor connected between said gate input of said first CMOS pair and said reference potential; wherein said capacitor and said resistor form an RC differentiating circuit with a time constant with a predetermined duration;

said resistor, said capacitor, and said at least first and second CMOS pairs providing a rectangular pulse width of the predetermined duration when an ESD voltage spike appears on a power rail of the target circuit; and a logic gate coupled to said output transistors and connected to receive said pulse as one input thereto and to receive an output enable signal as a second input thereto and, in response thereto, hold the output transistors off during the timed logic signal.

2. The protection circuit of claim 1 wherein the logic gate is a NAND gate.

3. The protection circuit of claim 1 wherein the logic gate is a NOR gate.

4. The protection circuit of claim 1 wherein the logic gate is an AND or a NOR gate.

5. The protection circuit of claim 1 wherein the predetermined pulse width is about 500 nanoseconds.

* * * * *